United States Patent
Hsia et al.

(10) Patent No.: US 8,154,005 B2
(45) Date of Patent: Apr. 10, 2012

(54) NON-VOLATILE MEMORY ARRAYS COMPRISING RAIL STACKS WITH A SHARED DIODE COMPONENT PORTION FOR DIODES OF ELECTRICALLY ISOLATED PILLARS

(75) Inventors: Kang-Jay Hsia, Pleasanton, CA (US); Christopher J. Petti, Mountain View, CA (US); Calvin K. Li, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 22 days.

(21) Appl. No.: 12/139,435

(22) Filed: Jun. 13, 2008

(65) Prior Publication Data
US 2009/0309089 A1 Dec. 17, 2009

(51) Int. Cl.
*H01L 29/06* (2006.01)
(52) U.S. Cl. ................ 257/5; 257/50; 365/148
(58) Field of Classification Search ............... 257/530, 257/656, 5; 438/138; 365/148, 153, 163
See application file for complete search history.

(56) References Cited

U.S. PATENT DOCUMENTS

| | | | |
|---|---|---|---|
| 5,835,396 A | 11/1998 | Zhang | |
| 6,034,882 A | 3/2000 | Johnson et al. | |
| 6,356,477 B1 | 3/2002 | Tran | |
| 6,420,215 B1 | 7/2002 | Knall et al. | |
| 6,515,888 B2 | 2/2003 | Johnson et al. | |
| 6,525,953 B1 | 2/2003 | Johnson | |
| 6,579,760 B1 | 6/2003 | Lung | |
| 6,631,085 B2 | 10/2003 | Kleveland et al. | |
| 6,642,603 B1 | 11/2003 | Knall | |
| 6,777,773 B2 | 8/2004 | Knall | |
| 6,951,780 B1 | 10/2005 | Herner | |
| 6,952,043 B2 | 10/2005 | Vyvoda et al. | |
| 6,984,561 B2 | 1/2006 | Herner et al. | |
| 7,005,350 B2 | 2/2006 | Walker et al. | |

(Continued)

FOREIGN PATENT DOCUMENTS
EP 0117045 A 8/1984

OTHER PUBLICATIONS

U.S. Appl. No. 12/344,022, filed Dec. 24, 2008.

(Continued)

*Primary Examiner* — Steven Loke
*Assistant Examiner* — David Ziskind
(74) *Attorney, Agent, or Firm* — Vierra Magen Marcus & DeNiro LLP

(57) ABSTRACT

An integrated circuit including vertically oriented diode structures between conductors and methods of fabricating the same are provided. Two-terminal devices such as passive element memory cells can include a diode steering element in series with an antifuse and/or other state change element. The devices are formed using pillar structures at the intersections of upper and lower sets of conductors. The height of the pillar structures are reduced by forming part of the diode for each pillar in a rail stack with one of the conductors. A diode in one embodiment can include a first diode component of a first conductivity type and a second diode component of a second conductivity type. A portion of one of the diode components is divided into first and second portions with one on the portions being formed in the rail stack where it is shared with other diodes formed using pillars at the rail stack.

17 Claims, 12 Drawing Sheets

U.S. PATENT DOCUMENTS

| | | | |
|---|---|---|---|
| 7,022,572 B2 | 4/2006 | Scheuerlein et al. | |
| 7,081,377 B2 | 7/2006 | Cleeves | |
| 7,285,464 B2 | 10/2007 | Herner et al. | |
| 7,405,465 B2 * | 7/2008 | Herner | 257/616 |
| 7,410,838 B2 * | 8/2008 | Ang | 438/131 |
| 2002/0081833 A1 | 6/2002 | Li et al. | |
| 2003/0016553 A1 | 1/2003 | Subramanian et al. | |
| 2004/0002184 A1 | 1/2004 | Cleeves | |
| 2004/0002186 A1 | 1/2004 | Vyvoda et al. | |
| 2004/0016991 A1 | 1/2004 | Johnson et al. | |
| 2005/0014322 A1 | 1/2005 | Herner et al. | |
| 2005/0242386 A1 | 11/2005 | Ang | |
| 2006/0073657 A1 | 4/2006 | Herner et al. | |
| 2006/0250836 A1 | 11/2006 | Herner et al. | |
| 2008/0002456 A1 | 1/2008 | Toda et al. | |
| 2008/0175031 A1 | 7/2008 | Park et al. | |
| 2008/0290335 A1 | 11/2008 | Lin et al. | |

OTHER PUBLICATIONS

U.S. Appl. No. 12/468,717, filed May 19, 2009.

International Search Report & The Written Opinion of the International Searching Authority dated Sep. 1, 2009, Patent Cooperation Treaty, International Application No. PCT/US2009/046001 filed Jun. 2, 2009.

Response to Official Communication dated Feb. 21, 2011, European Patent Application No. 09763292.1 filed Jun. 2, 2009.

International Preliminary Report on Patentability dated Dec. 13, 2010, Patent Cooperation Treaty, International Application No. PCT/US2009/046001 filed Jun. 2, 2009.

* cited by examiner ent portion of material trapped under the dielectric and not removed by the second etch.

There remains a need for improved pillar designs and corresponding fabrication processes for forming the same in non-volatile memory array technologies.

NON-VOLATILE MEMORY ARRAYS COMPRISING RAIL STACKS WITH A SHARED DIODE COMPONENT PORTION FOR DIODES OF ELECTRICALLY ISOLATED PILLARS

BACKGROUND OF THE INVENTION

1. Field of the Invention

Embodiments in accordance with the present disclosure are directed to integrated circuits containing non-volatile memory cell arrays and particularly those arrays incorporating passive element memory cells.

2. Description of the Related Art

Materials having a detectable level of change in state, such as a resistance or phase change, are used to form various types of non-volatile semiconductor based memory devices. For example, simple antifuses are used for binary data storage in one time field-programmable (OTP) memory arrays by assigning a lower resistance initial physical state of a memory cell to a first logical state such as logical '0,' and assigning a higher resistance physical state of the cell to a second logical state such as logical '1.' Some materials can have their resistance switched back in the direction of their initial resistance. These types of materials can be used to form re-writable memory cells. Multiple levels of detectable resistance in materials can further be used to form multi-state devices which may or may not be re-writable.

Materials having a memory effect such as a detectable level of resistance are often placed in series with a steering element to form a memory cell. Diodes or other devices having a non-linear conduction current are typically used as the steering element. The memory effect of the cell is often referred to as the state change element. In many implementations, a set of word lines and bit lines are arranged in a substantially perpendicular configuration with a memory cell at the intersection of each word line and bit line. Two-terminal memory cells can be constructed at the intersections with one terminal (e.g., terminal portion of the cell or separate layer of the cell) in contact with the conductor forming the respective word line and another terminal in contactor with the conductor forming the respective bit line. Such cells are sometimes referred to as passive element memory cells.

Two-terminal memory cells with resistive state change elements have been used in three-dimensional field programmable non-volatile memory arrays because of their more simple design when compared to other three-terminal memory devices such as flash EEPROM. Three-dimensional non-volatile memory arrays are attractive because of their potential to greatly increase the number of memory cells that can be fabricated in a given wafer area. In three-dimensional memories, multiple levels of memory cells can be fabricated above a substrate, without intervening substrate layers. One type of three-dimensional memory includes pillars of layers formed at the intersection of upper and lower conductors. The pillars can take on various configurations, including a steering element such as a diode in series with a state change element such as an antifuse or other state change material in one example.

The formation of pillar structures often includes etching a first plurality of layers into strips in a first direction, filling the gaps between strips with a dielectric material, depositing a second plurality of layers, and then etching both plurality of layers in a second direction orthogonal to the first. The formation of these pillar structures can include a number of fabrication processes that require precise alignment in forming the small feature sizes of the structures. These processes can present a range of difficulties. For example, the second etch process is typically selective so as not to etch the dielectric fill material. This can sometimes lead to the inadvertent shorting of adjacent structures due to stringers formed from a portion of material trapped under the dielectric and not removed by the second etch.

There remains a need for improved pillar designs and corresponding fabrication processes for forming the same in non-volatile memory array technologies.

SUMMARY OF THE INVENTION

An integrated circuit including vertically oriented diode structures between conductors and methods of fabricating the same are provided. Two-terminal devices such as passive element memory cells can include a diode steering element in series with an antifuse and/or other state change element. The devices are formed using pillar structures at the intersections of upper and lower sets of conductors. The height of the pillar structures are reduced by forming part of the diode for each pillar in a rail stack with one of the conductors. A diode in one embodiment can include a first diode component of a first conductivity type and a second diode component of a second conductivity type. A portion of one of the diode components is divided into first and second portions with one on the portions being formed in the rail stack where it is shared with other diodes formed using pillars at the rail stack.

An integrated circuit device according to one embodiment includes a first conductor elongated in a first direction above a substrate, a first set of strips including a second conductor and a first portion of a first diode component, and a pillar formed between the first conductor and the first set of strips. The first set of strips are elongated in a second direction above the substrate, where the second direction is substantially orthogonal to the first direction. The pillar includes a second portion of the first diode component, a second diode component, and a state change element in series between the first conductor and the first set of strips.

A non-volatile semiconductor memory in accordance with another embodiment includes a substrate, a plurality of substantially parallel and substantially coplanar first conductors at a first height above the substrate, a plurality of substantially parallel and substantially coplanar rail stacks at a second height above the substrate, and a plurality of pillars formed between intersections of the plurality of first conductors and the plurality of rail stacks. The first conductors are elongated in a first direction and the rail stacks are elongated in a second direction substantially orthogonal to the first direction. Each rail stack includes a second conductor and a first portion of a first diode component for a plurality of diodes associated with the rail stack. The plurality of pillars include a first set of pillars formed at the intersection of a first rail stack and the plurality of first conductors. The first set of pillars each include a second portion of the first diode component for the plurality of diodes associated with the first rail stack, a second diode component and a state change element.

A method of fabricating an integrated circuit device is provided in one embodiment that includes forming a plurality of substantially parallel and substantially coplanar first conductors at a first height above a substrate, forming a plurality of substantially parallel and substantially coplanar rail stacks at a second height above the substrate, and forming a plurality of pillars between intersections of the plurality of first conductors and the plurality of rail stacks. The first conductors are elongated in a first direction and the rail stacks are elongated in a second direction that is substantially orthogonal to the first direction. Each rail stack includes a second conductor and a first portion of a first diode component for a plurality of diodes of pillars associated with the rail stack. The plurality of pillars can include a first set of pillars formed at the intersection of a first rail stack and the plurality of first conductors. The first set of pillars can each include a second portion of the first diode component for the plurality of diodes corresponding to the first rail stack, a second diode component and a state change element.

Other features, aspects, and objects of the disclosed technology can be obtained from a review of the specification, the figures, and the claims.

DETAILED DESCRIPTION

Figure 1:
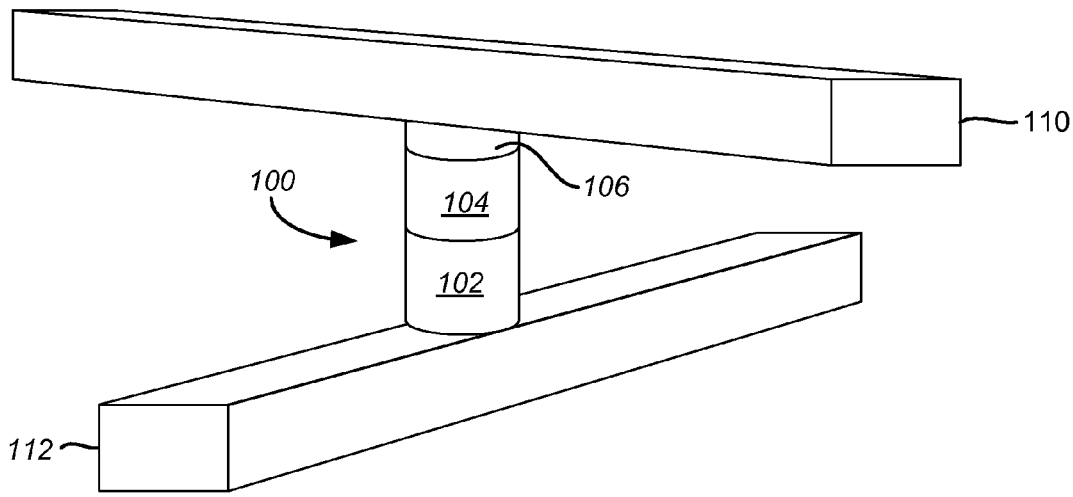
FIG. 1 depicts an exemplary two-terminal non-volatile memory cell having a steering element in series with a state change element and antifuse.

FIG. 1 depicts an exemplary structure of a two-terminal non-volatile memory cell including a pillar 100 of layers formed at an intersection between upper and lower conductors. A first terminal portion of the memory cell is connected to a first conductor 110 and a second terminal portion of the memory cell is connected to a second conductor 112. The memory cell is co-extensive with pillar 100, including a steering element 102 in series with a state change element 104 and an anti-fuse 106 to provide non-volatile date storage.

The steering element can take the form of any suitable device exhibiting a nonlinear conduction current characteristic such as a simple diode. The state change element will vary by embodiment and can include numerous types of materials to store data through representative physical states. State change element 104 can include resistance change materials, phase change resistive materials, etc. A semiconductor or other material having at least two levels of detectable resistance change (e.g., low to high and high to low) can be used to form a passive storage element. By assigning logical data values to the various levels of resistance that can be set and read from resistance change element 104, the memory cell formed from pillar 100 can provide reliable data read/write capabilities. Anti-fuse 106 can further provide resistance state change abilities that can be exploited for non-volatile data storage. An anti-fuse is manufactured in a high resistance state and can be popped or fused to a lower resistance state. An anti-fuse is typically non-conductive in its initial state and exhibits high conductivity with low resistance in its popped or fused state. As a discreet device or element may have a resistance and different resistance states, the terms resistivity and resistivity state are used to refer to the properties of materials themselves. Thus, while a resistance change element or device may have resistance states, a resistivity change material may have resistivity states. Various types of antifuses can be used, including but not limited to dielectric rupture antifuses, intrinsic or lightly doped polycrystalline semiconductor antifuses and amorphous semiconductor antifuses, for example.

Anti-fuse 106 can provide benefits to memory cell 100 beyond its state change ability. For example, an anti-fuse can serve to set the on-resistance of the memory cell in at an appropriate level relative to the read-write circuitry associated with the cell. These circuits are typically used to pop the anti-fuse and have an associated resistance. Because these circuits drive the voltages and current levels to pop the anti-fuse, the anti-fuse tends to set the memory cell in an appropriate on-resistance state for these same circuits during later operations.

A variety of materials exhibit resistivity change behavior suitable for implementing state change element 104. Examples of suitable materials include, but are not limited to, doped semiconductors (e.g., polycrystalline silicon, more commonly polysilicon), transition metal oxides, complex metal oxides, programmable metallization connections, phase change resistive elements, organic material variable resistors, carbon polymer films, doped chalcogenide glass, and Schottky barrier diodes containing mobile atoms that change resistance. The resistivity of these materials in some cases may only be set in a first direction (e.g., high to low), while in others, the resistivity may be set from a first level (e.g., higher resistance) to a second level (e.g., lower resistance), and then reset back to the first resistivity level. State change element 104 can be an antifuse in one embodiment.

A range of resistance values can be assigned to a physical data state to accommodate differences amongst devices as well as variations within devices after set and reset cycling. The terms set and reset are typically used, respectively, to refer to the process of changing an element from a high resistance physical state to a low resistance physical state (set) and changing an element from a low resistance physical state to a higher resistance physical state (reset).

Other types of two-terminal non-volatile memory cells can be used in accordance with embodiments of the present disclosure. For example, one embodiment does not include an anti-fuse 106 and merely includes state change element 104 and steering element 102. Other embodiments may include additional state change elements in place of or in addition to the anti-fuse. Various types of suitable memory cells are described in U.S. Pat. No. 6,034,882 entitled "Vertically Stacked Field Programmable Non-volatile Memory and Method of Fabrication." Various other types of cells may be used, including those described in U.S. Pat. No. 6,420,215 and U.S. patent application Ser. No. 09/897,705 entitled "Three-Dimensional Memory Array Incorporating Serial Chain Diode Stack" filed on Jun. 29, 2001, and U.S. patent application Ser. No. 09/560,626 entitled "Three-Dimensional Memory Array and Method of Fabrication" filed on Apr. 28, 2000, all hereby incorporated by reference in their entirety.

Figure 2:
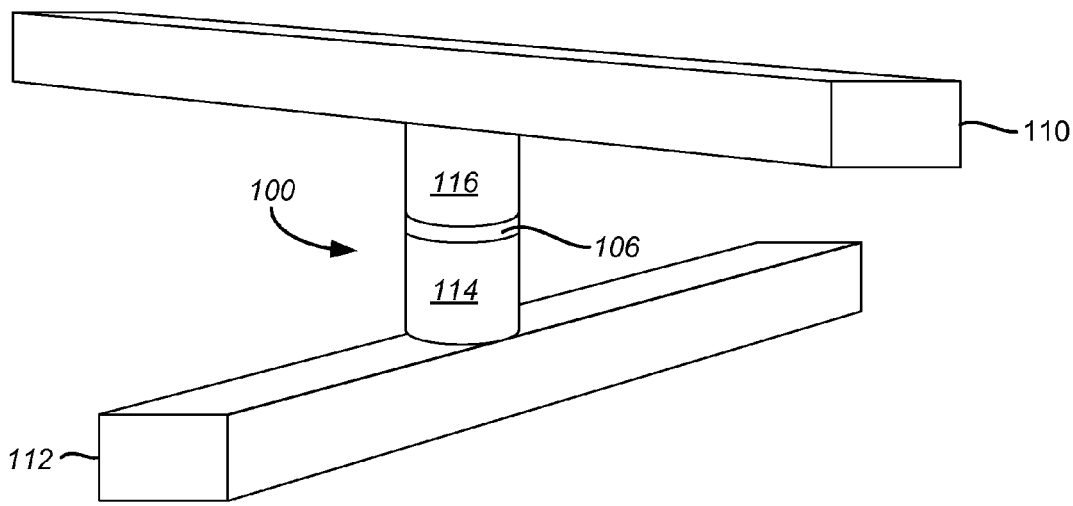
FIG. 2 depicts an exemplary two-terminal non-volatile memory cell having an antifuse layer between diode components.

FIG. 2 depicts another exemplary structure of a two-terminal non-volatile memory cell formed from a pillar of layers at the intersection of upper and lower conductors. In this example, the steering element is a diode having a first diode component 114 and a second diode component 116 separated by an antifuse layer 106. Such arrangements are sometimes referred to as incipient diodes. The diode can include various combinations of materials of different conductivity types suitable for forming an appropriate diode junction. For example, the first diode component 114 can be a highly doped polysilicon layer and the second component an intrinsic or lightly doped polysilicon layer of a different conductivity type. Undoped regions may not be perfectly electrically neutral, resulting from defects, contaminants, etc. that may cause it to behave as is slightly doped. Such a diode is still considered to have an intrinsic layer. In one embodiment, the first component 114 is a heavily doped P+ silicon layer and the second component is an intrinsic or lightly doped N− layer 116. Of course, the N− and P+ type layers can be reversed in another embodiment. Additionally, a heavily doped N+ silicon layer can be used for one component and an intrinsic or lightly doped P− silicon layer used for the other component. The second component can also be heavily doped in another example.

A state change element 104 is not included in FIG. 2, although one can be added in series with the antifuse and diode in another embodiment. It is noted that the diode steering element itself may be used as a state change element in one embodiment. It has been discovered that materials used to form the diodes in some memory cells themselves exhibit resistive change abilities. For example, in one embodiment the intrinsic region of the diode is formed of polysilicon which has demonstrated abilities to be set from a higher resistivity state to a lower resistivity state, and then reset back to a higher resistivity state from the lower resistivity state. Accordingly, the diode itself, or a portion thereof, may also form a state change element for the memory cell. In other embodiments, one or more additional layers may be included in pillar 100 for the memory cell to form a state change element. For example, an additional layer of polysilicon, transition metal oxide, etc. may be included in the cell to provide a state change memory effect. This additional layer may be included between a diode component and one of the conductors, for example.

Conductors 110 and 112 are typically orthogonal to one another and form part of the array terminal lines for accessing an array of memory cells. The array terminal lines (also called array lines) at one layer may be termed word lines or X-lines. The array lines at a vertically adjacent layer may be termed bit lines or Y-lines. A memory cell can be formed at the projected intersection of each word line and each bit line, and connected between the respective intersecting word line and bit line as shown for the formation of a memory cell at the pillar 100. A three-dimensional memory array which has at least two levels of memory cells (i.e., two memory planes) may utilize more than one layer of word lines and/or more than one layer of bit lines.

Figure 3A:
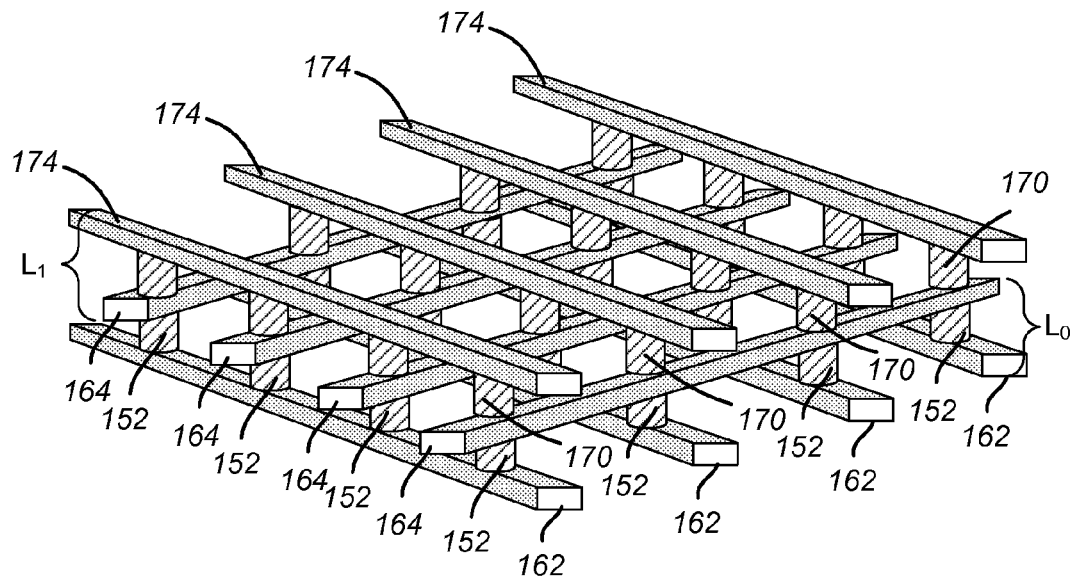
FIGS. 3A and 3B are respective perspective and cross-sectional views of a three-dimensional memory array.
Figure 3B:
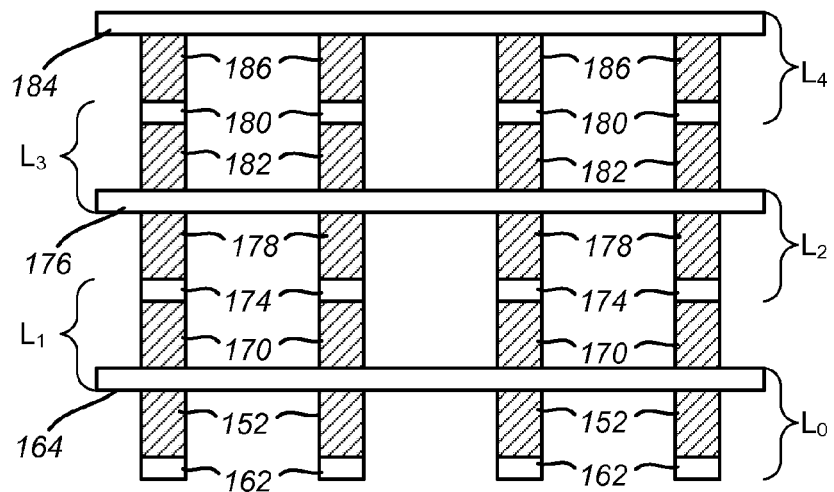

FIGS. 3A-3B depict a portion of an exemplary monolithic three-dimensional memory array. A monolithic three dimensional memory array is one in which multiple memory levels are formed above a single substrate, such as a wafer, with no intervening substrates. Both the word line and bit line layers are shared between memory cells in the structure depicted in the perspective view of FIG. 3A. This configuration is often referred to as a fully mirrored structure. A plurality of substantially parallel and coplanar conductors form a first set of bit lines 162 at a first memory level L0. Memory cells 152 at level L0 include pillars formed between the bit lines and adjacent word lines 164. In the arrangement of FIGS. 3A-3B, word lines 164 are shared between memory layers L0 and L1 and thus, further connect to memory cells 170 at memory level L1. A third set of conductors form the bit lines 174 for these cells at level L1. These bit lines 174 are in turn shared between memory levels L1 and memory level L2, depicted in the cross-sectional view of FIG. 3B. Memory cells 178 are connected to bit lines 174 and word lines 176 to form the third memory level L2, memory cells 182 are connected to word lines 176 and bit lines 180 to form the fourth memory level L3, and memory cells 186 are connected to bit lines 180 and word lines 184 to form the fifth memory level L5. The arrangement of the diodes' polarity and the respective arrangement of the word lines and bit lines can vary by embodiment. Additionally, more or less than five memory levels can be used.

The diode steering elements for a given memory cell level in the embodiment of FIG. 3A can be formed upside down relative to the diodes of the previous memory cell level. For example, if cells 152 include a bottom heavily doped region that is P+ type and a top intrinsic or lightly doped N− type region, then in the second level of cells 170, the bottom heavily doped region may be N− type while the top heavily doped region is P+ type.

In an alternative embodiment, an inter-level dielectric can be formed between adjacent memory levels. No conductors are shared between memory levels. This type of structure for three-dimensional monolithic storage memory is often referred to as a non-mirrored structure. In some embodiments, adjacent memory levels that share conductors and adjacent memory levels that do not share conductors can be stacked in the same monolithic three dimensional memory array. In other embodiments, some conductors are shared while others are not. For example, only the word lines or only the bit lines can be shared in some configurations. A first memory level L0 can include memory cells between a bit line level BL0 and word line level WL0. The word lines at level WL0 can be shared to form cells at a memory level L1 that connect to a second bit line level BL1. The bit line layers are not shared so the next layer can include an interlayer dielectric to separate bit lines BL1 from the next level of conductors. This type of configuration is often referred to as half-mirrored. Memory levels need not all be formed having the same type of memory cell. If desired, memory levels using resistive change materials can alternate with memory levels using other types of memory cells, etc.

Figure 4A:
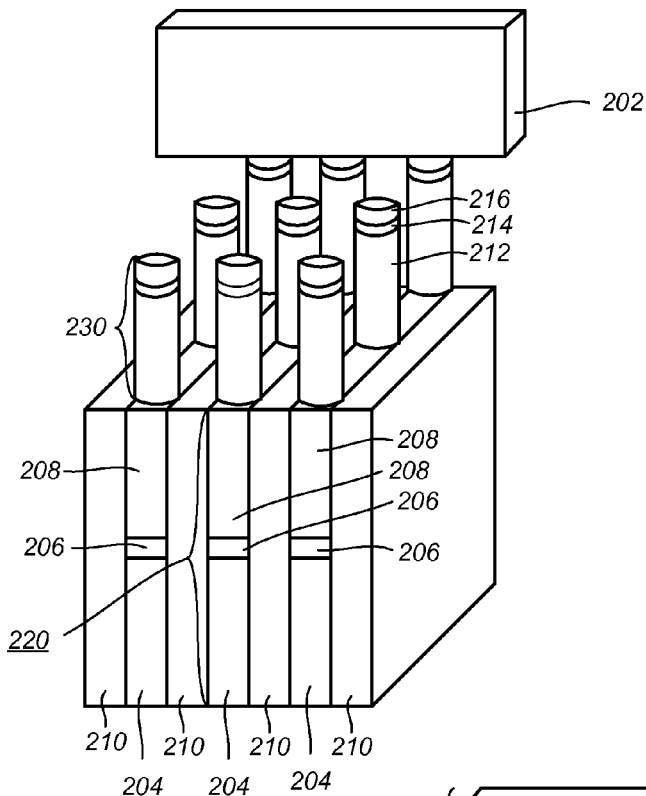
FIG. 4A is a perspective view of a portion of a non-volatile memory array in accordance with one embodiment of the disclosed technology.

FIG. 4A depicts a portion of a monolithic three-dimensional non-volatile memory array in accordance with one embodiment of the present disclosure. Memory cells are formed using pillar structures 230 at the intersection between first conductors 202 and second conductors 204. Only one first conductor 202 is depicted in FIG. 4A for clarity. Each second conductor 204 is part of a rail stack of layers that further includes a heavily doped N+ type silicon layer 206 and intrinsic or lightly doped N− type silicon layer 208. The rail stacks are separated from adjacent rail stacks by strips 210 of dielectric material, such as silicon oxide. Heavily doped layer 206 provides good electrical contact to the underlying metal conductor layer 204. This highly doped silicon layer will stop ohmic transitions, thereby preventing the unintended formation of Schottky diodes at the junction of the metal conductor with an underlying intrinsic or lightly doped layer, for example. Various doping techniques can be used in forming the doped materials described herein. By way of example, in-situ doping during deposition can be used in one embodiment. Other doping techniques such as ion implantation, plasma immersion, gas source diffusion or solid source diffusion can also be used. Moreover, different doping techniques can be used when forming different layers of the array in one embodiment.

A plurality of pillar structures 230 are formed over layer 208, each including an additional layer 212 of intrinsic or lightly doped N− type silicon, an antifuse layer 214, and a layer 216 of heavily doped P+ type silicon. P+ type silicon layer 216 forms a first diode component for the memory cell of the corresponding pillar. The lightly doped or intrinsic N− type silicon layer 212 in each pillar forms a first portion of a second diode component for the memory cell of the corresponding pillar. The second diode component for each memory cell further includes a second portion formed from the underlying strips 208 of intrinsic or lightly doped N− type material. These strips 208 are thereby shared by every overlying pillar along its length in the first direction to form a portion of the second diode component for each pillar.

By moving a portion of the second diode component to rail stack 220, a reduced height pillar is formed. It has been discovered that some portion of the second diode component can be moved to the rail stack without adversely affecting the electrical performance of the memory cell. In this manner, the pillar height can be reduced while still forming discrete memory cells at the intersection of the upper and lower conductors. More details are provided below with respect to the electrical effects of forming a second portion of the second diode components in the rail stacks.

Although the first diode component is heavily doped P+ type silicon and the second diode component is intrinsic or lightly doped N− type silicon in FIG. 4A, different material combinations can be used to form the diode steering element. For example, a heavily doped N+ type material can be paired with an intrinsic or lightly doped P− type material is an alternate implementation. Additionally, the orientation of the materials will respect to the upper and lower conductors can be reversed in other embodiments.

Figure 4B:
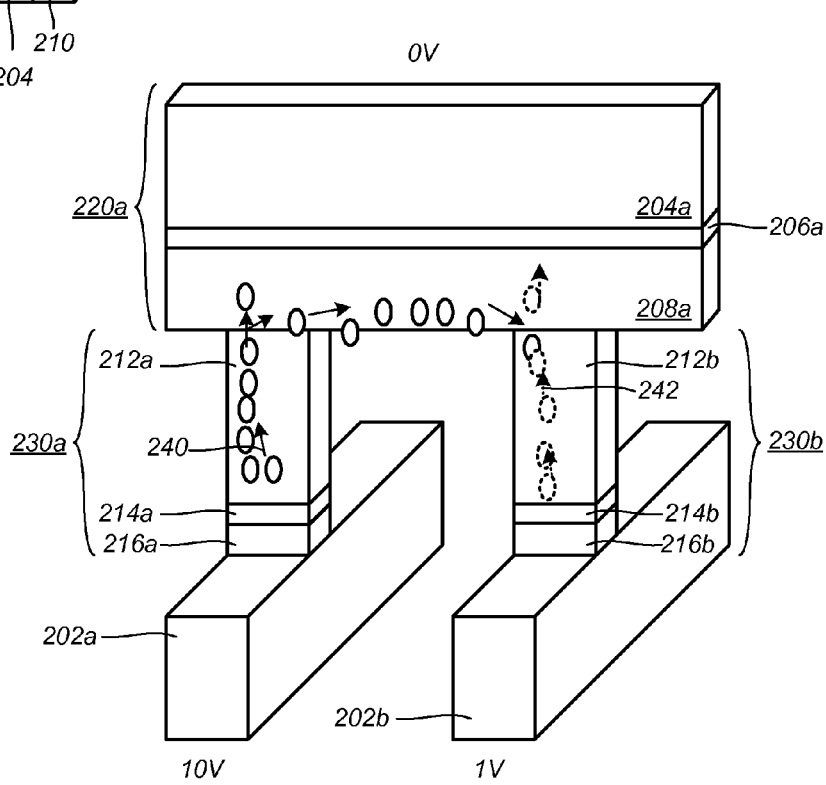
FIG. 4B is another perspective view of the non-volatile memory array of FIG. 4A, depicting the hole current flow in unselected and selected pillars during a non-volatile memory operation.

FIG. 4B depicts a portion of the non-volatile memory from FIG. 4A, illustrating that memory cells of the described array can be individually selected without disturbing unselected memory cells that connect to common selection lines. The orientation of the array has been flipped vertically in FIG. 4B and some portions omitted for the sake of clarity of presentation. A set of bias conditions are depicted for selecting the memory cell formed at pillar 230a, while not selecting the memory cell formed at pillar 230b. The bias conditions may be used to program the memory cell by popping or rupturing antifuse 214a at pillar 230a for example. It is important in such an operation to sufficiently isolate the memory cell at pillar 230a so that antifuse 214a can be adequately ruptured, while not disturbing or otherwise affecting antifuse 214b. In the particularly described embodiment, 10V is applied to selected first conductor 202a, while 1V is applied to unselected first conductor 202b and selected conductor 204a is grounded. Other unselected conductors 204a (not shown) in the second set of conductors can have a voltage of about 8V applied thereon in one embodiment.

Under the applied bias conditions, a strong electric field is generated through pillar 230a, with a direction from conductor 202a to conductor 204a. Because N− layer 208a is a common node electrically coupled to both pillars 230a and 230b, an induced current flow between selected conductor 202a and unselected conductor 220b through N− layer 208a may be expected. Such a driven current flow may raise concerns that the memory cell at pillar 230b may inadvertently be programmed or disturbed. It has been discovered, however, that some portion of the second diode component can be shared in a common rail stack while still avoiding unintentional disturb of the memory cells in unselected pillars.

The strong electrical field between conductor 202a and conductor 204a induces an injection hole current flow depicted by arrows 240 in the direction of the electric field. An electric field also exists in the unselected pillar 230b in a direction from conductor 202b to conductor 204a. This electric field also induces a hole current with a direction from conductor 202b to conductor 220a denoted by arrows 242. Although smaller than the electric field in the selected pillar, the electric field in the unselected pillar can be sufficiently strong to repel a majority of the injection holes from reaching the unselected antifuse 214b, thereby avoiding a disturb of the memory cell at pillar 230b.

Figure 5:
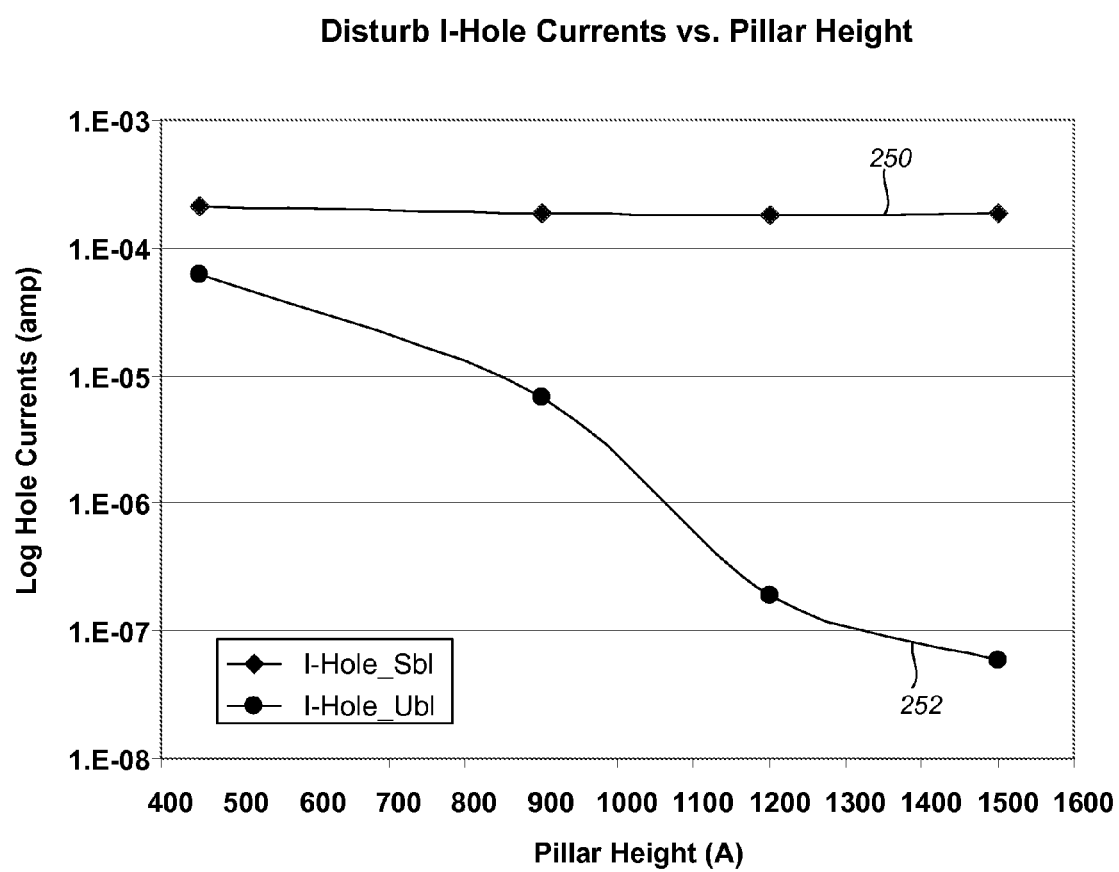
FIG. 5 is a graph depicting the hole current in unselected array lines as a function of the height of the pillar.

It is noted that a minority diffusion hole current may still reach the antifuse layer in unselected memory cells. However, the diffusion current decreases exponentially with distance such that an appropriate height of the pillar can be selected to minimize or eliminate any disturb issues that may be caused by the minority current. FIG. 5 is a graph showing the relationship between the minority diffusion hole current and the height of the pillar in one exemplary implementation. The hole current is expressed logarithmically along the y-axis as function of the pillar height, which is set forth along the x-axis. In the particularly described embodiment, an overall height of the N− layer forming the second portion of the diode component and the pillar is assumed to be about 3000 angstroms(A). As the height of the pillar is decreased, the height of the N− layer in the rail stack is increased by a corresponding amount so that the total height remains about 3000 A.

The current in a selected conductor 202a under the applied bias conditions is shown by line 250 and the current in an unselected conductor 202b is shown by line 252. At a pillar height of about 450 A, the current in the selected conductor is slightly more than $1 \times 10^{-03}$ amps, while the current in the unselected conductor is slightly less than $1 \times 10^{-04}$ amps. This level of current in the unselected pillars may be expected to create disturbance of the corresponding memory cells, such as by rupturing anti-fuses 214b. As the height of the pillar is increased, the current in the selected conductor remains about the same, while the current in the unselected conductor decreases. At a height of about 1050 A, the current in the unselected conductor drops to about $1 \times 10^{-6}$ amps. This current may be low enough not to pose a disturb concern. At about 1300 A, the current has dropped further to about $1 \times 10^{-7}$ amps. It is noted that the actual values expressed in FIG. 5 are exemplary only and will vary according to the materials, dopant levels and dimensions of the other layers in a given implementation. Fabricated devices can undergo testing to characterize the amount of disturb experienced at different pillar heights in order to precisely select an appropriate dimension for the desired implementation.

Figure 6A:
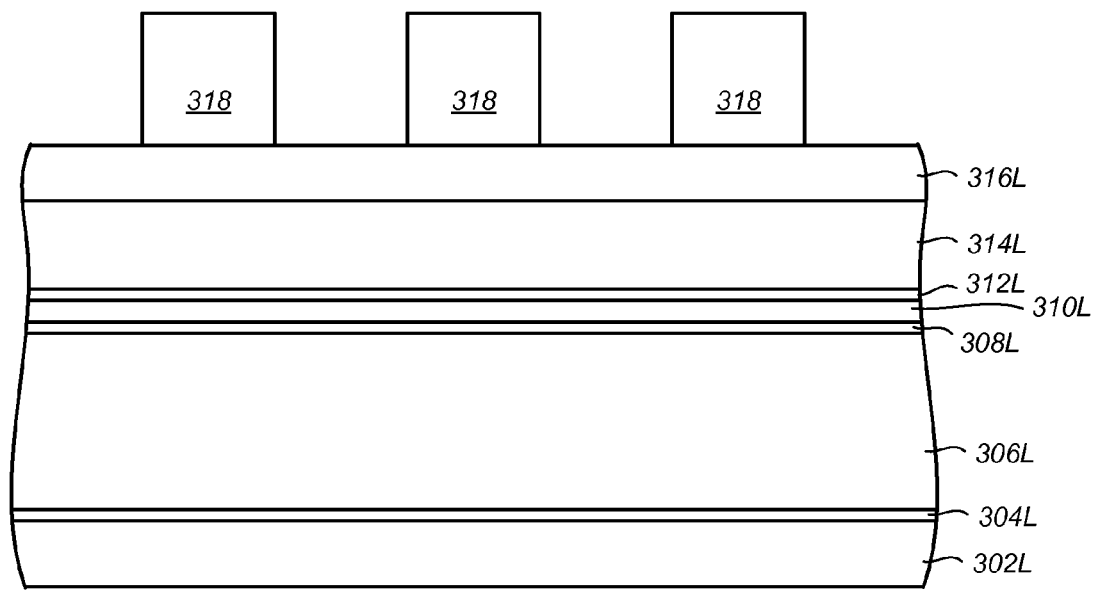
FIGS. 6A-6I are cross-section views depicting the fabrication of a non-volatile memory array in accordance with one embodiment of the disclosed technology.

FIGS. 6A-6I schematically illustrate the fabrication of a monolithic three-dimensional non-volatile memory array in accordance with one embodiment. The described fabrication may take place after forming one or more underlying memory levels in one embodiment. An insulating layer 302L is formed over a substrate (not shown) as shown in FIG. 6A. In some embodiments, the insulating layer 302L may be omitted, such as where a mirrored cell level arrangement is used and the processes are used to form an additional memory level over one or more preceding levels. The underlying substrate can be any semiconductor substrate, such as a monocrystalline silicon, IV-IV compounds, III-V compounds, II-VII compounds, etc. and include epitaxial or other semiconductor layers formed over the substrate. The substrate may include integrated circuits formed therein. Insulating layer 302L can include any suitable insulating material such as silicon dioxide, silicon nitride, high-dielectric films, etc.

An optional adhesion layer 304L is formed over the insulating material to help conducting layer 306L adhere. The adhesion layer can include, by way of non-limiting example, materials such as tantalum nitride, tungsten nitride, titanium tungsten, sputtered tungsten, titanium nitride or combinations of the same. The adhesion layer can be formed by any process known in the art, such as chemical vapor deposition (CVD), physical vapor deposition (PVD) or atomic layer deposition (ALD). In one embodiment, adhesion layer 304L is deposited to a thickness of about 100 A. The term thickness refers to vertical thickness, measured in a direction perpendicular to the substrate on which the layer is formed.

Conducting layer 306L is formed over adhesion layer 304L using known processes such as CVD or PVD. The conducting layer can include any suitable conductive material known in the art, including but not limited to tantalum, titanium, tungsten, copper, cobalt or alloys thereof. In one embodiment, Tungsten is deposited by CVD to a thickness of about 3000 A, although the thickness, material and process used can vary by embodiment. An optional adhesion layer 308L is formed over the first conducting layer 306L to a thickness of about 100 A. The adhesion layer can be formed of different materials as described for layer 304L. A silicon layer 310L having a first conductivity type is formed over conducting layer 308L. The silicon layer is a heavily-doped P+ type polysilicon layer in one embodiment having a thickness of about 200 A. Other thicknesses can be used. By way of example, the heavily doped P+ polysilicon layer can be doped at a concentration greater than $5\times10^{18}$ atoms/cm$^3$ in one embodiment. The P+ layer is doped at a concerntration greater than $1\times10^{19}$ atoms/cm$^3$ in another embodiment, and at a concentration greater than $1\times10^{20}$ atoms/cm$^3$ in yet another embodiment.

An antifuse layer 312L is formed over the heavily doped P+ type layer. The antifuse material is silicon dioxide in one embodiment that is deposited to a thickness of about 20-100 A. Other thicknesses can be used. A silicon layer 314L of material having a different conductivity type than layer 310L is formed over the antifuse layer. Layer 314L will form the first portion of a second diode component for each pillar. When layer 310L is a heavily doped P+ type silicon layer, layer 314L can be an undoped intrinsic silicon layer or a lightly doped silicon layer of an opposite conductivity type, namely N− in this example. In one embodiment layer 314L is deposited to a thickness of about 1300 A. In one embodiment where layer 314L is a lightly doped N-type material, the silicon is doped at a concentration less than $5\times10^{17}$ atoms/cm$^3$. In another embodiment, a concentration of less than $1\times10^{17}$ atoms/cm$^3$ or $1\times10^{16}$ atoms/cm$^3$ is used. A hard mask layer 316L is formed over N− layer 314L. Any suitable hard mask material can be used, including but not limited to silicon nitride for example. Strips 318 of photoresist are then formed over the hard mask using conventional photolithography techniques. The strips of photoresist are elongated in a first direction over the hard mask with spaces between strips adjacent in a second direction that is substantially perpendicular to the first direction. Spacer-assisted patterning or nano-imprint technologies can also be used to form a pattern at less than the minimum definable feature size of the photolithography process being used in one embodiment.

Figure 6B:
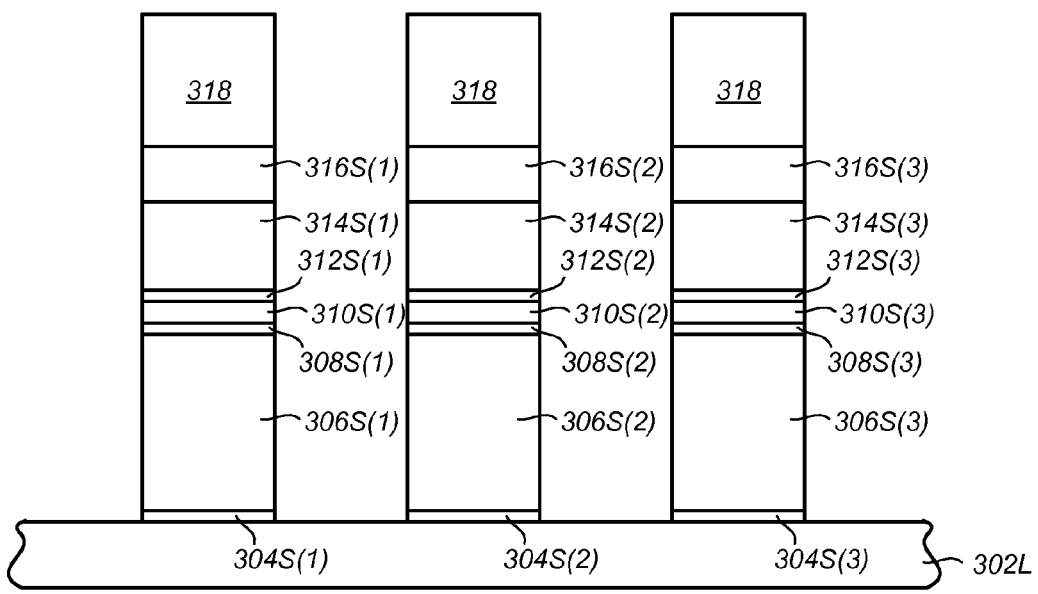

Using the photoresist as a pattern, the hard mask layer is etched, followed by etching through the underlying layers as depicted in FIG. 6B. Etching proceeds until insulating layer 302L is reached. Any suitable etching process or processes can be used. The layers are etched into strips that are elongated in the first direction with spaces between strips that are adjacent in the second direction. The width of the strips can vary by embodiment, but in one embodiment is about 450 A. Etching the layer stack forms a first set of conductors 306S(1)-(3) that are elongated in the first direction over the substrate. Layers 308L, 310L, 312L 314L and 316L are all etched into strips 308S(1)-(3), 310S(1)-(3), 312S(1)-(3), 314S(1)-(3) and 316S(1)-(3)

Figure 6C:
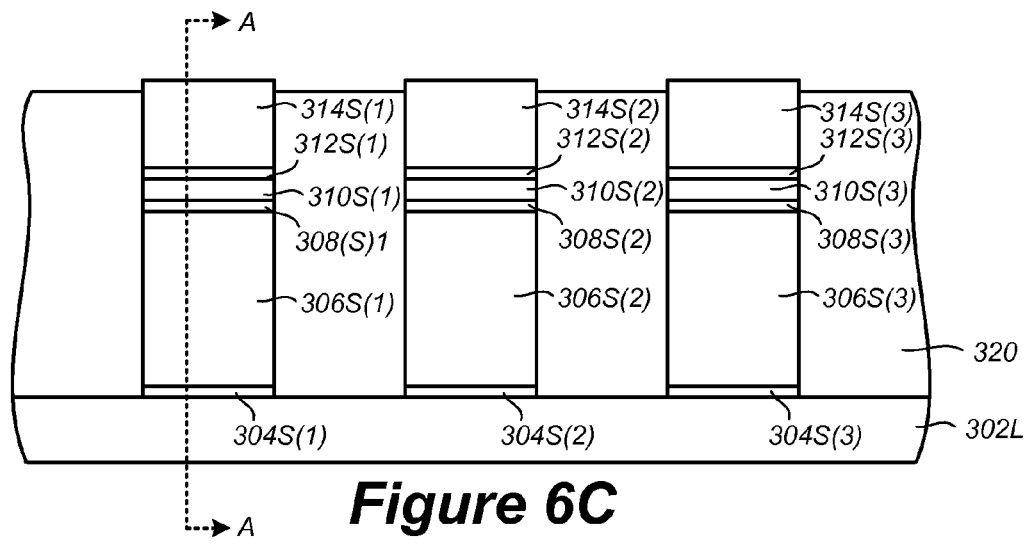

After etching to form the first conductors, the strips of photoresist and hard mask strips 316S(1)-(3) are removed. Conventional processes such as ashing in an oxygen-containing plasma can be used to remove the photoresist, followed by conventional processes such as a chemical wet etch to remove the hard mask layer. After removing the photoresist and hard mask, a dielectric material 320 is deposited over and between the strips as shown in FIG. 6C. The dielectric material can be any suitable electrically insulating material such as silicon dioxide, silicon nitride or silicon oxynitride. Excess dielectric material is removed using conventional techniques such as chemical mechanical polishing. A substantially planar surface is formed in one embodiment from strips 314S(1), 314S(2) and 314S(3) and the upper surface of the dielectric material separating the adjacent strips. The dielectric layer is recessed just below the upper surface of strips 314S(1)-(3) in another embodiment as illustrated in FIG. 6C.

Figure 6D:
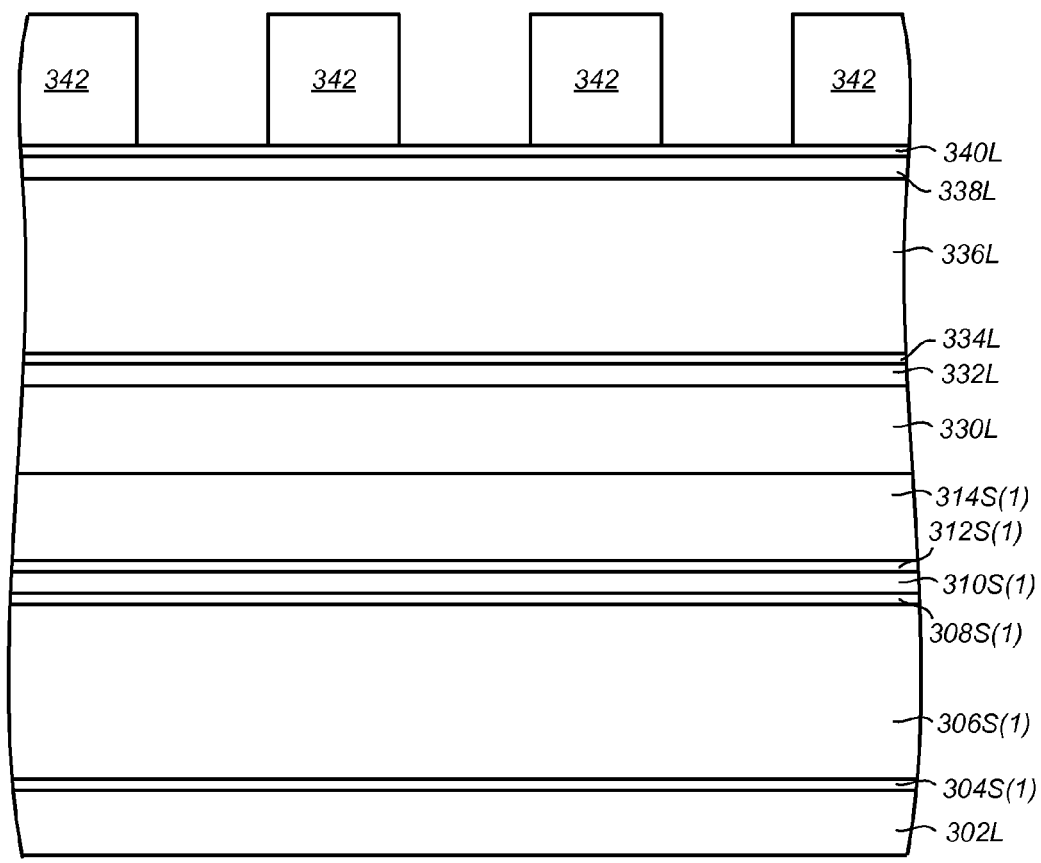

FIG. 6D is a cross-sectional view taken along line A--A in FIG. 6C showing a view through the array in the first direction. An adhesion layer strip 304S(1) overlies insulating layer 302L, followed by a first conductor 306S(1), another adhesion layer strip 308S(1), a heavily doped P+ silicon strip 310S(1), an antifuse layer strip 312S(1), and an intrinsic or lightly doped silicon strip 314S(1).

Over strip 314S(1) is then formed a second layer 330L of material having a different conductivity type than layer 310L. Layer 330L has the same conductivity type of material 314L and will form a second portion of the second diode component for multiple memory cells. Layer 330L is a second layer of lightly doped N− silicon in one embodiment, having a substantially similar dopant concentration to that of layer 314L. In one embodiment, layer 330L is about 1300A, although the thickness can vary by embodiment. Over layer 330L is formed a heavily doped layer 332L using conventional processes such as CVD. Layer 332L is a heavily doped N+ type silicon layer in one embodiment that provides good electrical contact with the overlying conducting layer and avoids the formation of Schottky diodes. Layer 332L is formed to a thickness of about 200 A in one embodiment. An adhesion layer 334L is formed over layer 332L. In one embodiment, the adhesion layer is a layer of TiN deposited to a depth of about 100 A, although other materials and thicknesses can be used as described with respect to layer 304L. A second conducting layer 336L is then formed over the adhesion layer. In one embodiment, the second conducting layer 336L is tungsten deposited by CVD or PVD to a thickness of about 3000 A. Other materials, processes and dimensions can be used as described with respect to first conducting layer 306L.

A next series of processes is used to form a pattern for etching layers 336L, 334L, 332L and 330L into a second set of rail stacks. The pattern is also used to etch strips 314S, 312S, 310S and 308S into pillars. First, a layer 338L of silicon is deposited to a thickness of about 300 A over conducting layer 336L. An optional adhesion layer can be formed between conducting layer 336L and silicon layer 338L. An oxide layer 340L is then deposited over the silicon layer to a thickness of about 200 A. Other thicknesses can be used. Strips 342 of photoresist elongated in the second direction are formed over the oxide layer. The strips of photoresist are separated by spaces in the first direction.

Figure 6E:
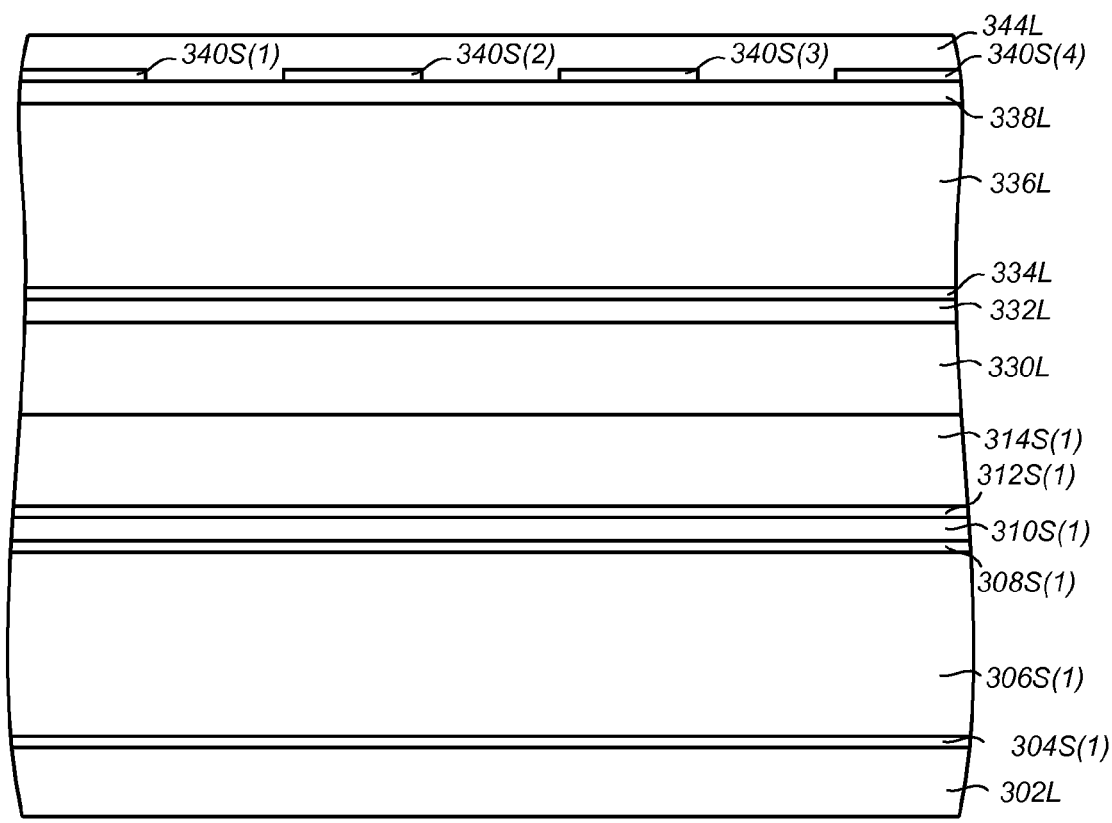
Figure 6F:
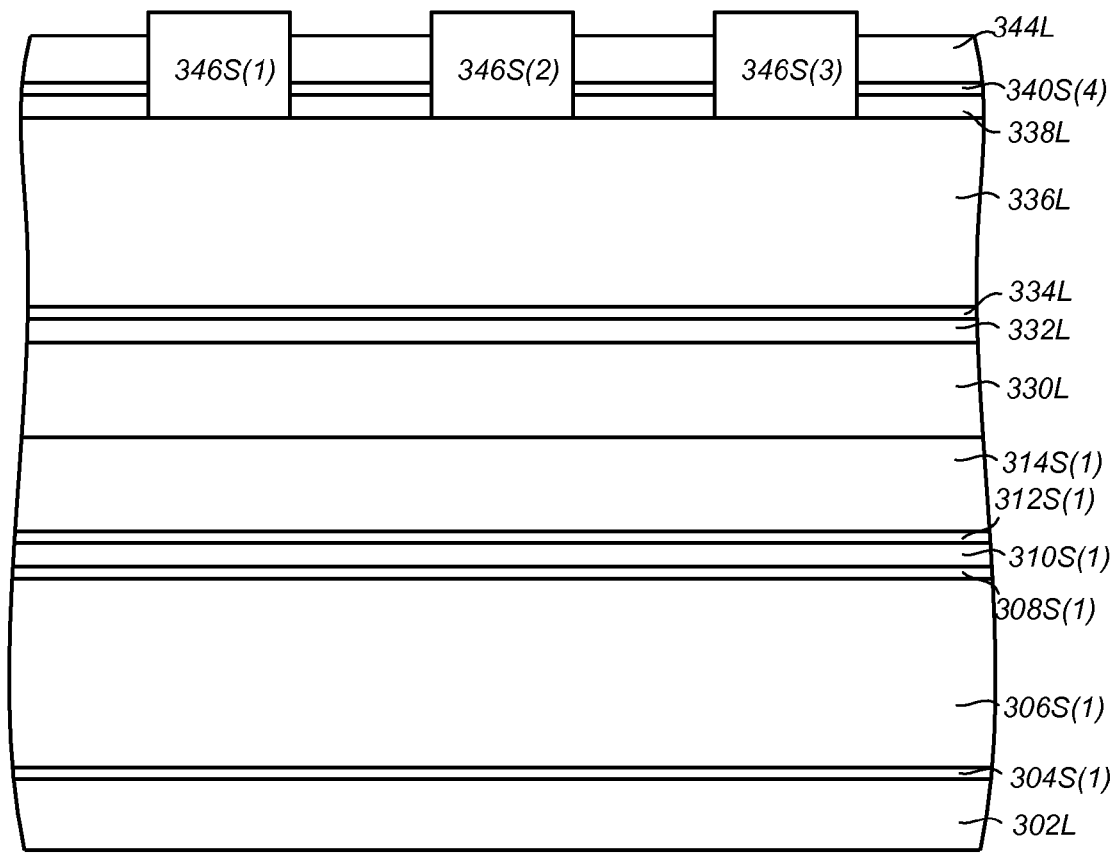

Using the photoresist as a mask, the oxide layer is etched into strips 340S(1), 340S(2) and 340S(3) that are elongated in the second direction over the silicon layer as shown in FIG. 6E. After etching, the photoresist is removed using a suitable process, followed by depositing a layer 344L of cobalt in the spaces between adjacent strips 340S of oxide layer 340L and over the upper surface of each strip. Cobalt shows good resistance to etching so that it can form a suitable hard masking layer for etching. In one embodiment, cobalt layer 344L is formed to a depth of about 500 Å. After depositing the cobalt, the wafer is annealed at a high temperature (e.g., 650° C.), causing the growth of cobalt silicon (CoSi) in the areas between adjacent strips of the oxide layer. FIG. 6F depicts strips 346S(1), 346S(2) and 346S(3) of CoSi resulting from the annealing process.

Figure 6G:
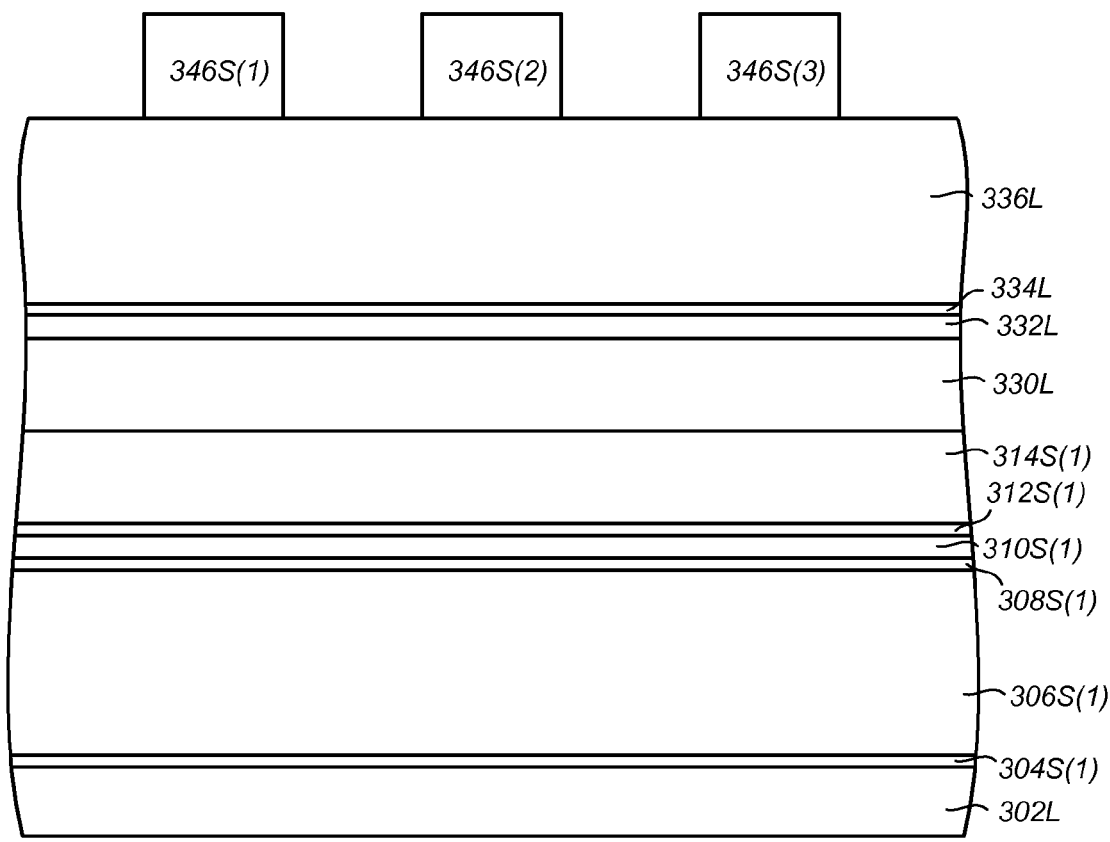
Figure 6H:
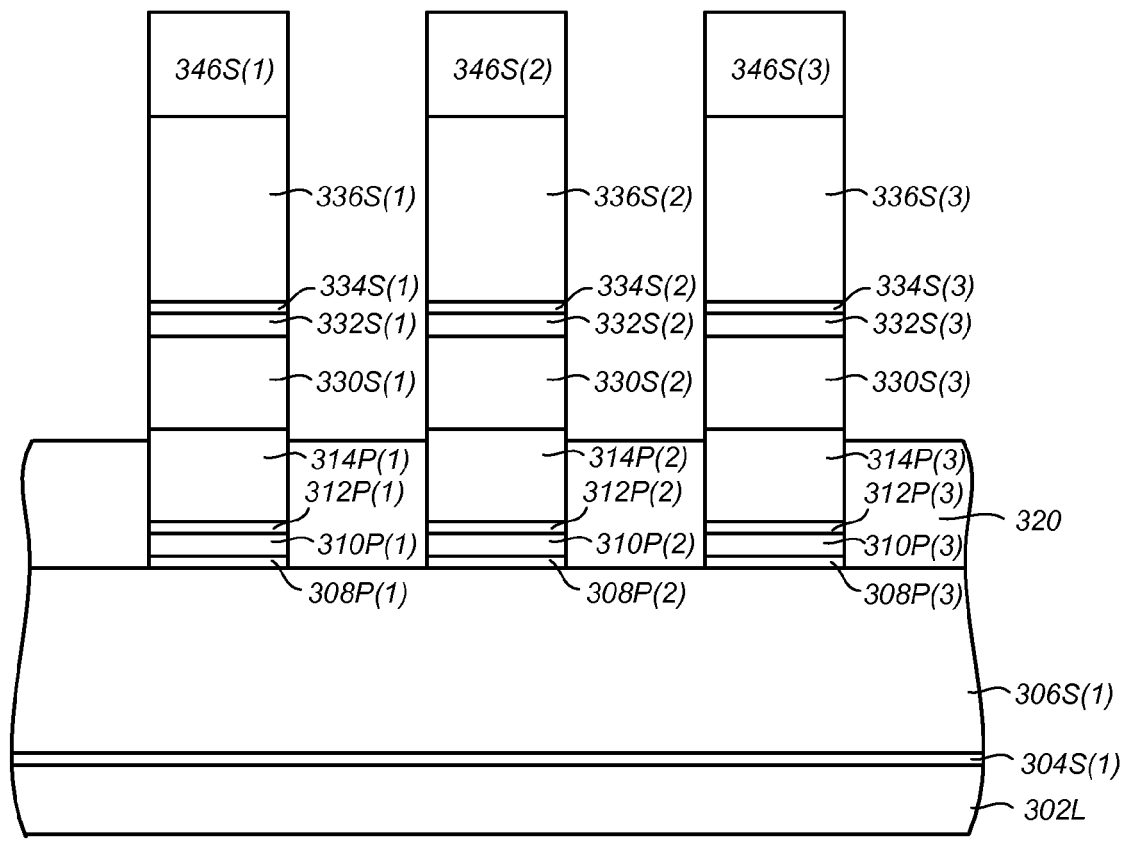
Figure 6I:
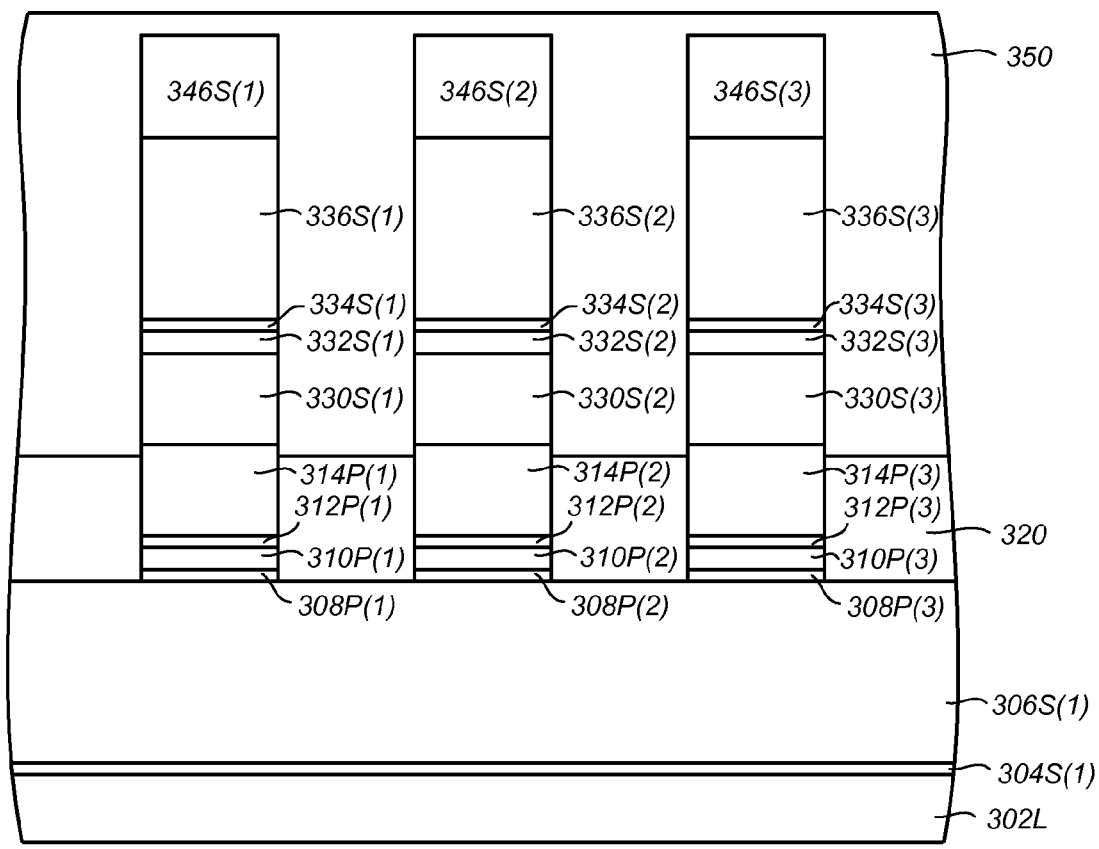

After annealing, the remaining portions of cobalt layer 344L, oxide layer 340L and silicon layer 338L are removed as shown in FIG. 6G. A chemical wet etch is used in one embodiment to strip these layers. Selective or non-selective etch processes can also be used. The strips of CoSi can then be used as a mask for etching the underlying layers. Etching proceeds through the underlying layers until adhesion layer 304L is reached as shown in FIG. 6H. A selective etch process is used in one embodiment to etch through these layers while not etching the dielectric material 320 that was used to fill the spaces between the strips formed from the first etch process. Etching conductive layer 336L forms a second set of conductors 336S(1), 336S(2), 336S(3) that are elongated in the second direction across the substrate with spaces therebetween in the first direction. The second set of conductors are part of a set of rail stacks, which further include strips 334S(1)-(3) of adhesion layer 334L, strips 332 S(1)-(3) of heavily doped N+ type ohmic contact layer 332L and strips 330 S(1)-(3) of intrinsic or lightly doped layer 330L. Etching strips 314S(1), 312S(1), 310S(1) and 308S(2) forms pillars. A first pillar is formed from regions 308P(1), 310P(1), 312P(1) and 314P(1), a second pillar is formed from regions 308P(2), 310P(2), 312P(2) and 314P(2) and a third pillar is formed from regions 308P(3), 310P(3), 312P(3) and 314P(3).

Following etching, another layer 350 of dielectric material is deposited over and between the rail stacks and pillars. Any suitable electrically insulating material such as silicon oxide can be used. An additional dielectric layer can be formed over dielectric layer 350 to form an inter-level dielectric layer to isolate the just formed memory level from a subsequently formed memory level. In other embodiments, an inter-level dielectric layer is not formed so that conductors 336S(1), etc. can be shared by the next memory level in a mirrored or half-mirrored arrangement. The CoSi hard mask layer can be removed in one embodiment before forming additional memory levels, although this is not required.

The aforementioned fabrication process is but one example of a suitable technique for forming a three-dimensional memory array having a portion of a diode component formed in a rail stack. In one embodiment for example, a damascene process can be used to form the intrinsic or lightly doped diode component material for the pillars. After forming lower rail stacks, each including an intrinsic or lightly doped diode component layer, oxide can be deposited as a gap fill between rail stacks and also above the rail stacks to the desired height of the pillars above the lower rail stacks. The oxide can be patterned, e.g. by printing to define locations therein for the pillars. The oxide can then be etched to define holes in the oxide into which is deposited the intrinsic or lightly doped silicon layer for pillar formation. Processing can then continue in a similar fashion to that as already described.

Figure 7:
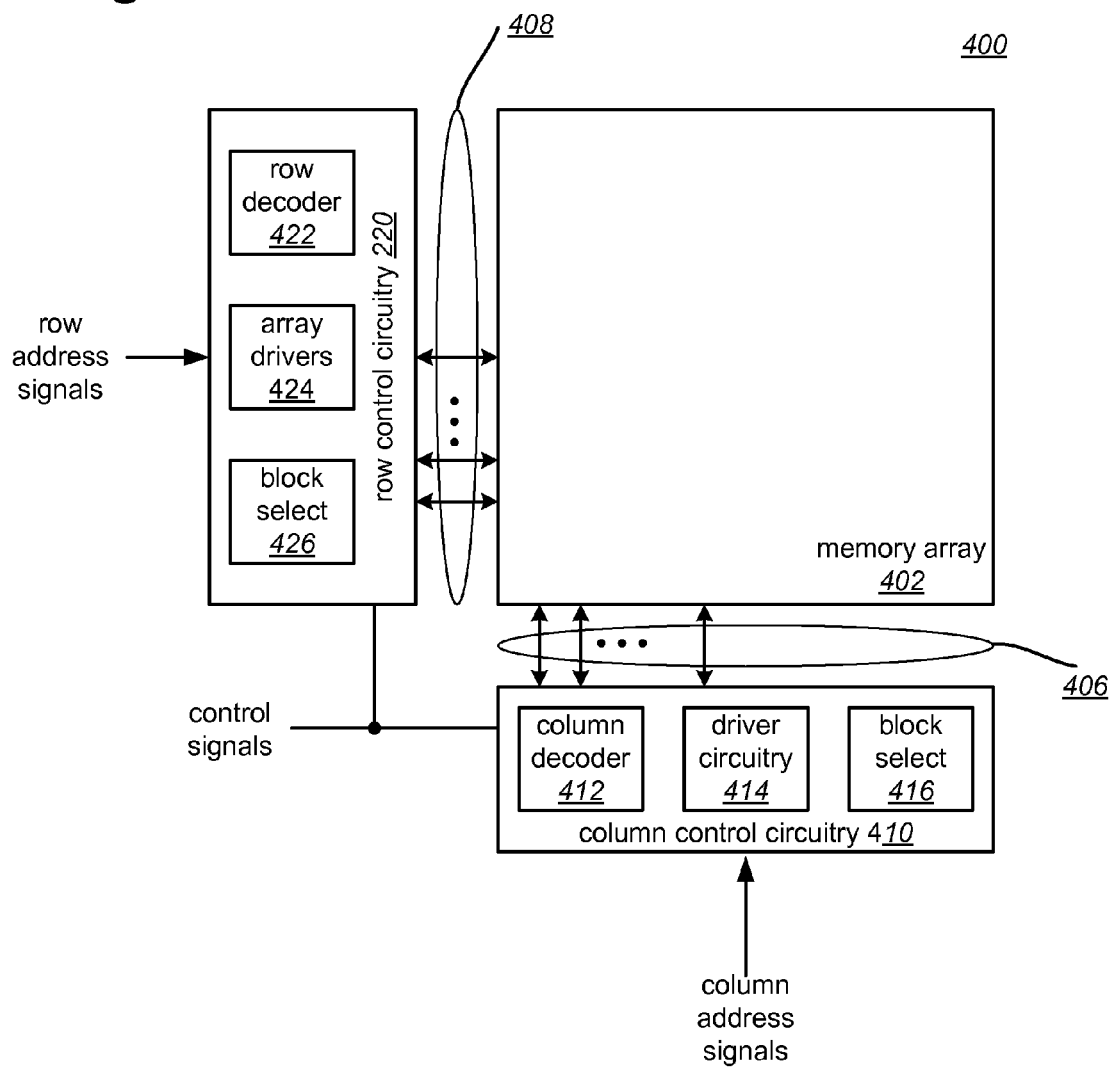
FIG. 7 is block diagram of a non-volatile memory system in accordance with one embodiment.

FIG. 7 is a block diagram of an exemplary integrated circuit including a memory array 402 that may be formed as described in FIGS. 4A-4B and 6A-6I. The array terminal lines of memory array 402 include the various layer(s) of word lines organized as rows, and the various layer(s) of bit lines organized as columns. The integrated circuit 400 includes row control circuitry 420 whose outputs 408 are connected to respective word lines of the memory array 402. The row control circuitry receives a group of M row address signals and one or more various control signals, and typically may include such circuits as row decoders 422, array terminal drivers 424, and block select circuitry 426 for both read and write (i.e., programming) operations. The integrated circuit 400 also includes column control circuitry 410 whose input/outputs 406 are connected to respective bit lines of the memory array 402. The column control circuitry 406 receives a group of N column address signals and one or more various control signals, and typically may include such circuits as column decoders 412, array terminal receivers or drivers 414, block select circuitry 416, as well as read/write circuitry, and I/O multiplexers. Circuits such as the row control circuitry 420 and the column control circuitry 410 may be collectively termed control circuitry or array terminal circuits for their connection to the various array terminals of the memory array 402.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An integrated circuit device, comprising:
   a first conductor elongated in a first direction above a substrate;
   a first set of strips including a second conductor and a first portion of a first diode component, the first set of strips elongated in a second direction above the substrate, the second direction being substantially orthogonal to the first direction; and
   a pillar formed between the first conductor and the first set of strips, the pillar including a second portion of the first diode component, a second diode component, and a state change element in series between the first conductor and the first set of strips, the first portion of the first diode component and the second portion of the first diode component both comprising an intrinsic layer of polysilicon; wherein the first portion of the first diode component extends in the second direction beyond the pillar.

2. The integrated circuit device of claim 1, wherein:
   the second diode component comprises a heavily doped silicon region of a first conductivity type.

3. The integrated circuit device of claim 2, wherein the first set of strips further comprises:
   a heavily doped polysilicon region of a second conductivity type formed between the second conductor and the first portion of the first diode component.

4. The integrated circuit device of claim 1, wherein the state change element is an antifuse.

5. The integrated circuit device of claim 4, wherein the antifuse is formed between the second portion of the first diode component and the second diode component.

6. An integrated circuit device according to claim 1, wherein the pillar further comprises an antifuse in series with the first diode component, the second diode component and the state change element.

7. An integrated circuit device according to claim 1, wherein:

the first conductor, the second conductor, the first portion of the first diode component, the state change element, the second portion of the first diode component and the second diode component form at least one non-volatile memory cell.

8. An integrated circuit device according to claim 7, wherein the at least one non-volatile memory cell is a field-programmable re-writable memory cell.

9. An integrated circuit device according to claim 7, wherein:
- the integrated circuit includes a monolithic three-dimensional non-volatile memory array;
- the at least one non-volatile memory cell is formed at a first memory level of the monolithic three-dimensional non-volatile memory array; and
- the integrated circuit includes at least one additional memory level.

10. An integrated circuit device, comprising:
- a first conductor elongated in a first direction above a substrate;
- a first set of strips including a second conductor and a first portion of a first diode component, the first set of strips elongated in a second direction above the substrate, the second direction being substantially orthogonal to the first direction; and
- a pillar formed between the first conductor and the first set of strips, the pillar including a second portion of the first diode component, a second diode component, and a state change element in series between the first conductor and the first set of strips, the first portion of the first diode component and the second portion of the first diode component both comprising a layer of lightly doped polysilicon of a first conductivity type, the second diode component comprising a heavily doped polysilicon region of a second conductivity type, the second conductivity type being opposite to the first conductivity type;
- wherein the first portion of the first diode component extends in the second direction beyond the pillar.

11. The integrated circuit device of claim 10, wherein the first set of strips further comprises:
- a heavily doped polysilicon region of the first conductivity type formed between the second conductor and the first portion of the first diode component.

12. The integrated circuit device of claim 10, wherein the state change element is an antifuse.

13. The integrated circuit device of claim 12, wherein the antifuse is formed between the second portion of the first diode component and the second diode component.

14. An integrated circuit device according to claim 10, wherein the pillar further comprises an antifuse in series with the first diode component, the second diode component and the state change element.

15. An integrated circuit device according to claim 10, wherein:
- the first conductor, the second conductor, the first portion of the first diode component, the state change element, the second portion of the first diode component and the second diode component form at least one non-volatile memory cell.

16. An integrated circuit device according to claim 15, wherein the at least one non-volatile memory cell is a field-programmable re-writable memory cell.

17. An integrated circuit device according to claim 15, wherein:
- the integrated circuit includes a monolithic three-dimensional non-volatile memory array;
- the at least one non-volatile memory cell is formed at a first memory level of the monolithic three-dimensional non-volatile memory array; and
- the integrated circuit includes at least one additional memory level.

* * * * *